(12) United States Patent
Yee et al.

(10) Patent No.: US 8,138,591 B2
(45) Date of Patent: Mar. 20, 2012

(54) INTEGRATED CIRCUIT PACKAGE SYSTEM WITH STACKED DIE

(75) Inventors: Jae Hak Yee, Shanghai (CN); Junwoo Myung, Kyungsang-do (KR); Byoung Wook Jang, Seoul (KR)

(73) Assignee: STATS ChipPAC Ltd, Singapore (SG)

( * ) Notice: Subject to any disclaimer, the term of this patent is extended or adjusted under 35 U.S.C. 154(b) by 182 days.

(21) Appl. No.: 11/860,460

(22) Filed: Sep. 24, 2007

(65) Prior Publication Data

US 2008/0073770 A1 Mar. 27, 2008

Related U.S. Application Data

(60) Provisional application No. 60/826,738, filed on Sep. 23, 2006.

(51) Int. Cl.
*H01L 23/06* (2006.01)

(52) U.S. Cl. .......................... 257/684; 257/685; 257/686

(58) Field of Classification Search .................. 257/723, 257/724, 686, 685, 684
See application file for complete search history.

(56) References Cited

U.S. PATENT DOCUMENTS

| | | | |
|---|---|---|---|
| 6,605,875 B2 * | 8/2003 | Eskildsen | 257/777 |
| 7,199,458 B2 * | 4/2007 | Lee | 257/686 |
| 2003/0141583 A1 * | 7/2003 | Yang | 257/686 |
| 2004/0056277 A1 * | 3/2004 | Karnezos | 257/200 |
| 2005/0093167 A1 * | 5/2005 | Saeki | 257/774 |
| 2006/0170091 A1 * | 8/2006 | Karnezos | 257/686 |
| 2007/0108583 A1 | 5/2007 | Shim et al. | |
| 2007/0158810 A1 | 7/2007 | Song et al. | |
| 2007/0158813 A1 | 7/2007 | Kim | |
| 2007/0187811 A1 | 8/2007 | Arai et al. | |

* cited by examiner

*Primary Examiner* — Steven Loke
*Assistant Examiner* — Kimberly M Thomas
(74) *Attorney, Agent, or Firm* — Mikio Ishimaru

(57) ABSTRACT

An integrated circuit package system comprising forming a trace frame including: fabricating a sacrificial substrate; forming a first series of bonding pads along a length of the sacrificial substrate; forming a second series of the bonding pads along a width of the sacrificial substrate; forming conductive traces for connecting the bonding pads of the first series to the bonding pads of the second series in a one to one correspondence; and removing the sacrificial substrate.

10 Claims, 6 Drawing Sheets

INTEGRATED CIRCUIT PACKAGE SYSTEM WITH STACKED DIE

CROSS-REFERENCE TO RELATED APPLICATION(S)

This application claims the benefit of U.S. Provisional Patent Application Ser. No. 60/826,738 filed Sep. 23, 2006.

TECHNICAL FIELD

The present invention relates generally to integrated circuit packaging, and more particularly to a system for stacking high density integrated circuits.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the nonvolatile storage of information such as cellular phone numbers, digital pictures, or music files. Numerous technologies have been developed to meet these requirements.

Various types of non-volatile memories have been developed including electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erase ability.

A newer type of memory called "Flash" EEPROM, or Flash memory, has become popular because it combines the advantages of the high density and low cost of EPROM with the electrical erase ability of EEPROM. Flash memory can be rewritten and can hold its contents without power. Contemporary Flash memories are packaged in standard sized packages with ever increasing pressure on capacity within the package. As a result, device capacity is increasing and the packaging techniques are becoming more difficult as more devices have to be put into the standard package outline.

As commercial innovation continues, many new products are being developed that incorporate combinations of chips, such as processors and memory. The different technologies used to develop these devices may not be suitable for including them on the same silicon wafer. In order to facilitate rapid and reliable product development and manufacturing, these devices may be packaged together in a single enclosure. Many of the latest products have standardized the type of memory or accessory devices that they can interface with. In order to maintain the standard format some devices must be redesigned to support a second geometry of a popular interface device. This development can be very costly and create delays in delivering new products.

Thus, a need still remains for an integrated circuit package stacking system. In view of the demand for higher capacity memories in the standard package formats, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system comprising forming a trace frame including: fabricating a sacrificial substrate; forming a first series of bonding pads along a length of the sacrificial substrate; forming a second series of the bonding pads along a width of the sacrificial substrate; forming conductive traces for connecting the bonding pads of the first series to the bonding pads of the second series in a one to one correspondence; and removing the sacrificial substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
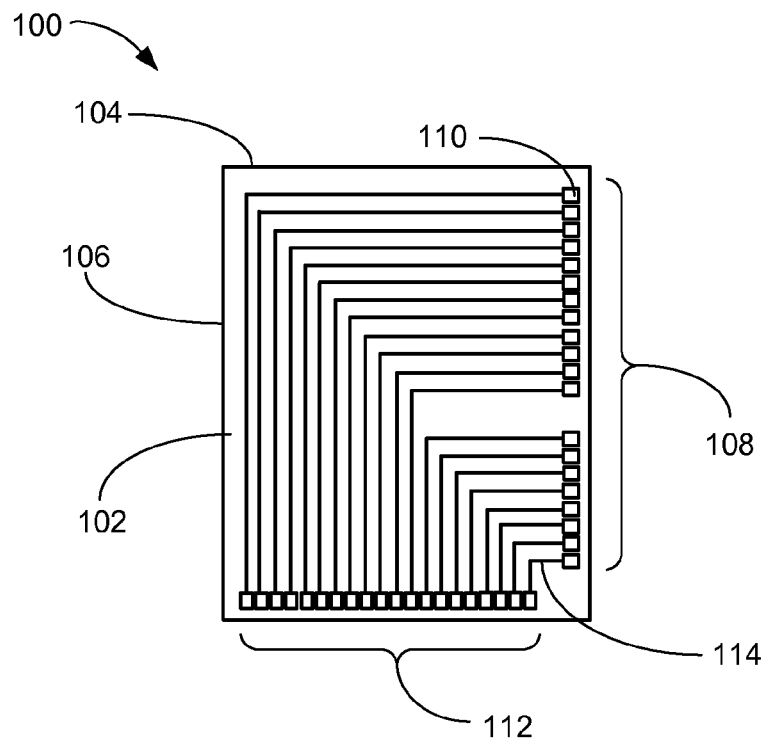
FIG. 1 is a top view of a trace frame assembly, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown is a top view of a trace frame assembly 100, in an embodiment of the present invention. The top view of the trace frame assembly 100 depicts a sacrificial substrate 102, such as a copper substrate, having a rectangular shape where a width 104 is smaller than a length 106. A first series 108 of bonding pads 110 is aligned along the length 106 of the sacrificial substrate 102. A second series 112 of the bonding pads 110 is aligned along the width 104 of the sacrificial substrate 102. A conductive trace 114, such as a metal trace, connects the individual elements of the first series 108 of the bonding pads 110 to an individual element of the second series 112 of the bonding pads 110 creating a one to one correspondence between the first series 108 of the bonding pads 110 and the second series 112 of the bonding pads 110.

The alignment of the first series 108 of the bonding pads 110 along the length 106 of the sacrificial substrate 102 may be used to fabricate a package in package structure that has a square finished outline, such as the standard package of a compact flash memory or it may be patterned on a printed circuit board. If the same integrated circuit devices require packaging in a rectangular package, such as the standard package for a secure digital memory, the second series 112 of the bonding pads 110 may be used. This flexibility allows the same integrated circuit device to be packaged in two standard package formats without design changes to the integrated circuit. This embodiment allows rapid development of new products and a highly reliable and manufacturable package design.

Figure 2:
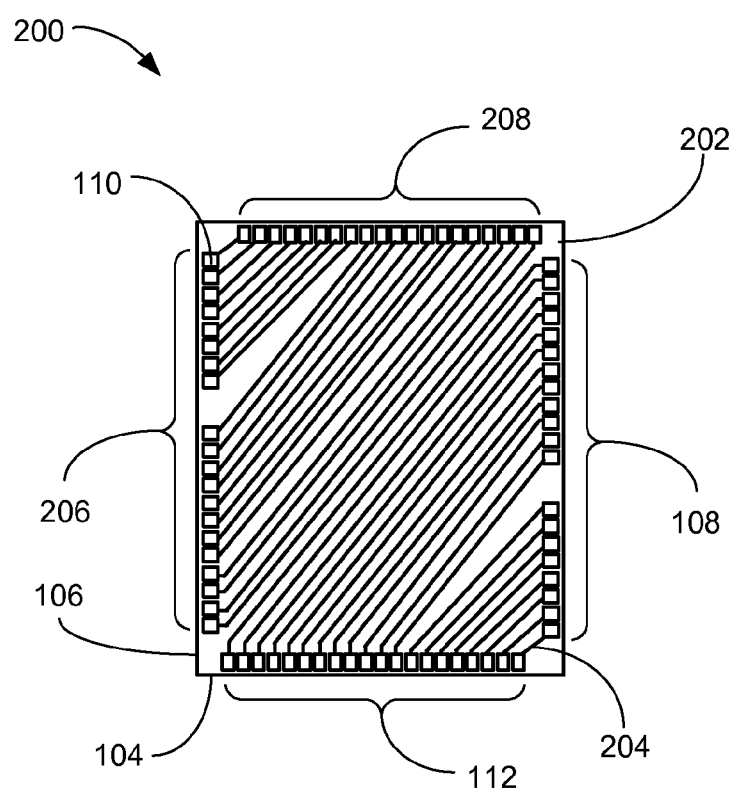
FIG. 2 is a top view of a trace frame assembly, in an alternative embodiment of the present invention.

Referring now to FIG. 2, therein is shown a top view of a trace frame assembly 200, in an alternative embodiment of the present invention. The top view of the trace frame assembly 200 depicts a sacrificial substrate 202, such as a copper substrate, having the first series 108 of the bonding pads 110 aligned along the length 106 of the sacrificial substrate 202. The second series 112 of the bonding pads 110 is aligned along the width 104 of the sacrificial substrate 202. The first series 108 and the second series 112 are joined in a one to one correspondence by a conductive trace 204, such as a metal trace.

A third series 206 of the bonding pads 110 is aligned along the length 106 on the opposite side of the first series 108 on the sacrificial substrate 202. A fourth series 208 of the bonding pads 110 is aligned along the width 104 opposite the second series 112. The third series 206 and the fourth series 208 are joined in a one to one correspondence by the conductive trace 204, such as a metal trace. This embodiment allows connection of integrated circuits that have contacts, such as bonding pads, on two sides.

Figure 3:
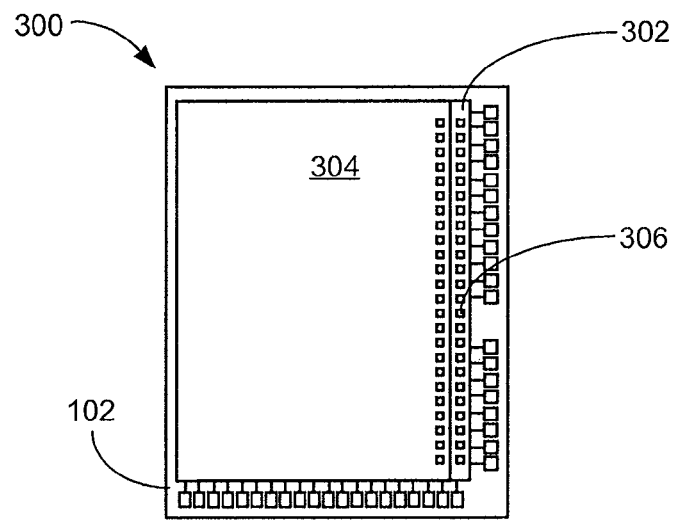
FIG. 3 is a top view of a trace frame assembly in a die attach phase of manufacture.

Referring now to FIG. 3, therein is shown a top view of a trace frame assembly 300 in a die attach phase of manufacture. The top view of the trace frame assembly 300 depicts the trace frame assembly 100 in a first phase of package assembly. A first integrated circuit die 302 is attached on the trace frame assembly 100. The bonding pads 110, of FIG. 1, and the conductive traces 114, of FIG. 1, are shown to extend beyond the first integrated circuit die 302 for further processing. A second integrated circuit die 304 is attached, in a staggered position, on the first integrated circuit die 302. Bonding contacts 306 may be patterned on the first integrated circuit die 302, the second integrated circuit die 304, or a combination thereof. In a preferred embodiment, the first integrated circuit die 302 and the second integrated circuit die 304 may be of the same type or of a different type. A possible embodiment may combine the first integrated circuit die 302, such as a memory, with the second integrated circuit die 304 which might be an encryption processor or the like.

Figure 4:
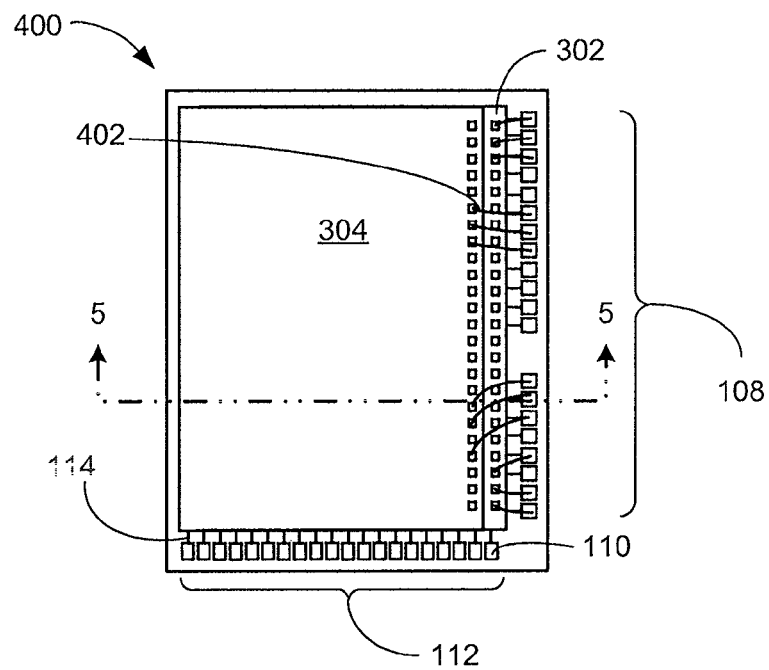
FIG. 4 is a top view of the trace frame assembly, of FIG. 3, in a coupling phase of manufacture.

Referring now to FIG. 4, therein is shown a top view of a trace frame assembly 400 in a coupling phase of manufacture. The top view of the trace frame assembly 400 depicts the trace frame assembly 300 having electrical interconnects 402, such as bond wires, coupled between the bonding pads 110, the first integrated circuit die 302, the second integrated circuit die 304, or a combination thereof. The bonding pads 110 extend beyond the length and width of the first integrated circuit die 302 and the second integrated circuit die 304. The conductive traces 114 connecting to the bond pads 110 also extend beyond the length and width of the first integrated circuit die 302 and the second integrated circuit die 304.

The electrical interconnects 402 are shown coupled to only some of the bonding pads 110, but this is for clarity only. The electrical interconnects 402 may be coupled to any or all of the bonding pads 110 in the first series 108 or the second series 112. The electrical interconnects 402 may be coupled to contact pads located along the edge of the first integrated circuit die 302 and the second integrated circuit die 304.

Figure 5:
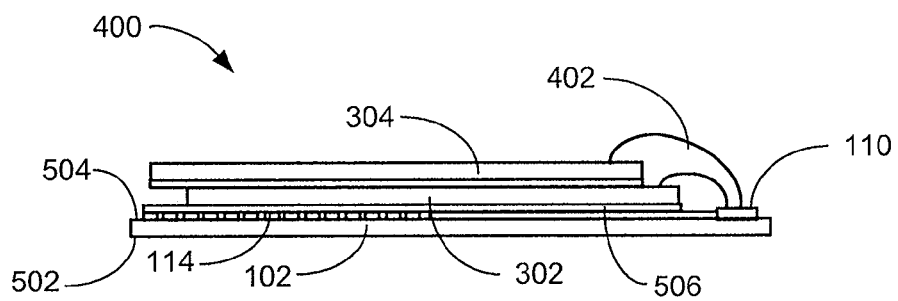
FIG. 5 is a cross-sectional view of the trace frame assembly of FIG. 4 along a section line 5-5.

Referring now to FIG. 5, therein is shown a cross-sectional view of the trace frame assembly 400 of FIG. 4 along a section line 5-5. The cross-sectional view of the trace frame assembly 400 depicts the trace frame assembly 100 having a bottom surface 502 and a top surface 504. The first integrated circuit die 302 may be mounted over the conductive trace 114 on the top surface 504. An adhesive layer 506, such as a film adhesive or a non-conductive epoxy, may be applied on the conductive traces 114 prior to mounting the first integrated circuit die 302. The bonding pad 110 is on the top surface 504. The second integrated circuit die 304 may be mounted on the adhesive layer 506 applied over the first integrated circuit die 302. The electrical interconnect 402 may couple the second integrated circuit die 304 to the bonding pad 110 or the first integrated circuit die 302. This is an example for clarity of the figure.

The electrical interconnect 402 may actually couple the bonding pad 110, the first integrated circuit die 302, the second integrated circuit die 304, or a combination thereof. Also by way of an example the figure shows the first integrated circuit die 302 and the second integrated circuit die 304 mounted over the trace frame assembly 100 while an actual embodiment of the invention may have more than two of the integrated circuits mounted over the trace frame assembly 100.

Figure 6:
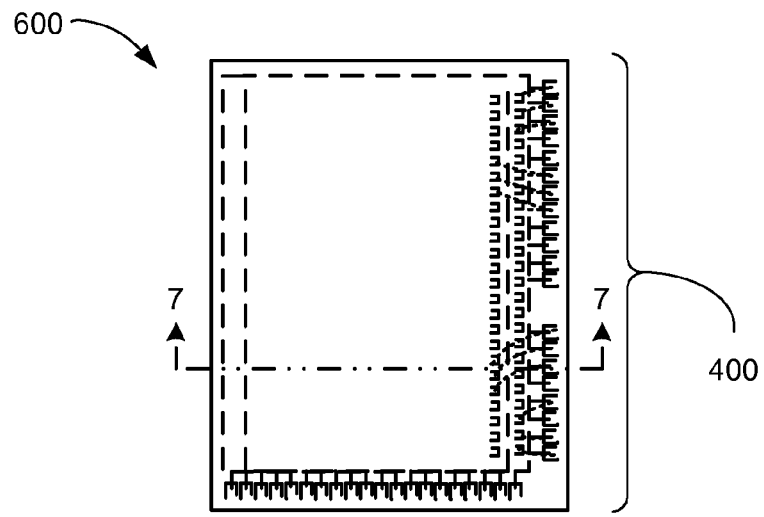
FIG. 6 is a top plan view of a stacked die package assembly, in a molding phase of manufacture.

Referring now to FIG. 6, therein is shown a top plan view of a stacked die package assembly 600 in a molding phase of manufacture. The top plan view of the stacked die package assembly 600 depicts the trace frame assembly 400 of FIG. 4 encapsulated, such as by a molding compound.

Figure 7:
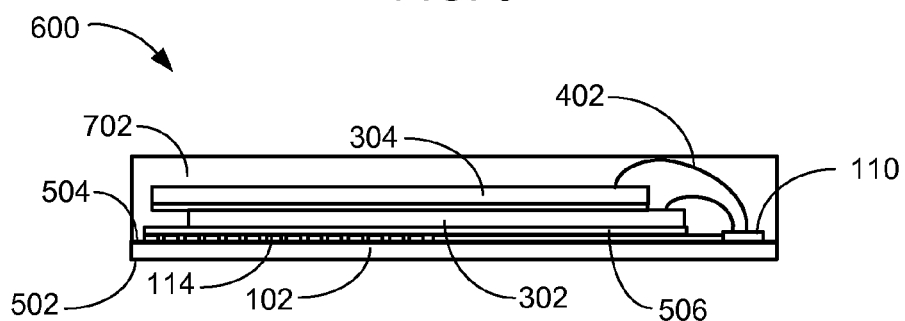
FIG. 7 is a cross-sectional view of the stacked die package assembly of FIG. 6 along a section line 7-7.

Referring now to FIG. 7, therein is shown a cross-sectional view of the stacked die package assembly 600 of FIG. 6 along a section line 7-7. The cross-sectional view of the stacked die package assembly 600 depicts the trace frame assembly 100 having the bottom surface 502 and the top surface 504. The first integrated circuit die 302 may be mounted on the top surface 504. The bonding pad 110 is on the top surface 504. The second integrated circuit die 304 may be mounted on the first integrated circuit die 302. The electrical interconnect 402 may couple the second integrated circuit die 304 to the bonding pad 110 or to the first integrated circuit die 302. This is an example for clarity of the figure.

The electrical interconnect 402 may actually couple the bonding pad 110, the first integrated circuit die 302, the second integrated circuit die 304, or a combination thereof. Also by way of an example the figure shows the first integrated circuit die 302 and the second integrated circuit die 304 mounted over the trace frame assembly 100 while an actual embodiment of the invention may have more than two of the integrated circuits mounted over the trace frame assembly 100. An encapsulant 702, such as an epoxy molding compound, may be applied on the top surface 504 of the trace frame assembly 100. The encapsulant 702 may be on the first integrated circuit die 302, the second integrated circuit die 304, the bonding pad 110, conductive trace 114 and the electrical interconnect 402. The first integrated circuit die 302 is on the conductive traces 114.

Figure 8:
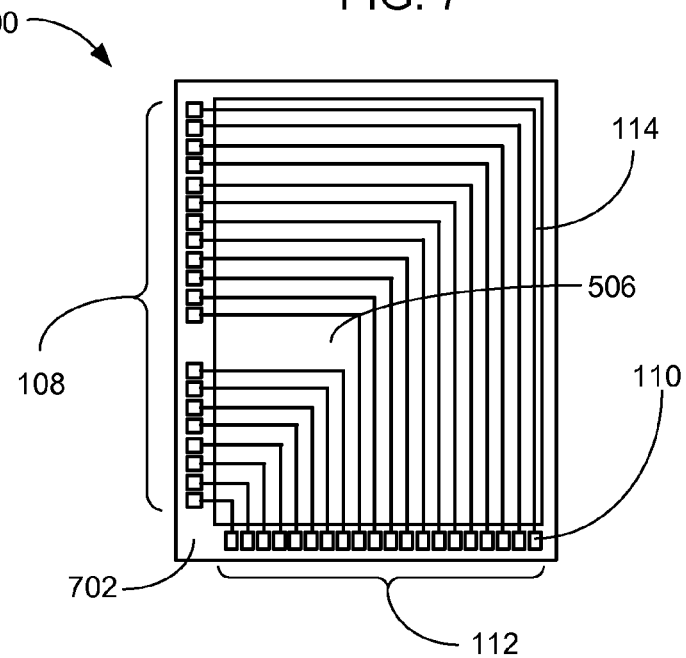
FIG. 8 is a bottom view of a stacked die package, in an etching phase of manufacturing.

Referring now to FIG. 8, therein is shown a bottom view of a stacked die package 800, in an etching phase of manufacturing. The bottom view of the stacked die package 800 depicts the sacrificial substrate 102 of FIG. 7 is removed, by an etching process, leaving the first series 108 and the second series 112 on the encapsulant 702. The conductive traces 114 on the adhesive layer 506 connect the individual elements of the first series 108 to the individual elements of the second series 112 creating a one to one correspondence between the first series 108 and the second series 112. The bond pads 110 and the conductive traces 114 are along a length and width of the encapsulant 702. The bond pads 110 and the conductive traces 114 extend beyond the first integrated circuit die 302 of FIG. 7 and the second integrated circuit die 304 of FIG. 7.

Figure 9:
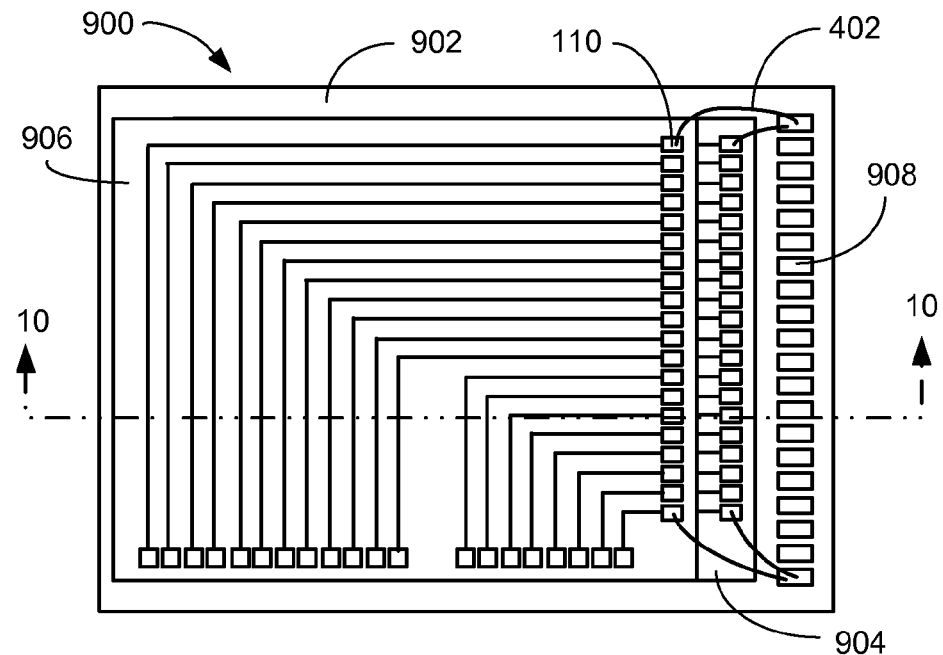
FIG. 9 is a top view of the integrated circuit package system, in a rectangular digital package format.

Referring now to FIG. 9, therein is shown a top view of an integrated circuit package system 900, in a rectangular digital package format. The top view of the integrated circuit package system 900 depicts a package substrate 902 in the shape of a rectangular digital package, such as a secure digital memory package. A first stacked die package 904 is mounted on the package substrate 902. The first stacked die package 904 is positioned so that the bonding pads 110 are accessible for connection to the package substrate 902.

A second stacked die package 906 is mounted on the first stacked die package 904. The second stacked die package 906 is mounted in an offset position allowing access to the bonding pads 110 of both the first stacked die package 904 and the second stacked die package 906. System bonding pads 908 are aligned along the narrow edge of the package substrate 902. The electrical interconnects 402 may couple the system bonding pads 908, the bonding pads 110 on the first stacked die package 904, the bonding pads 110 on the second stacked die package 906, or a combination thereof. The figure shows the electrical interconnects 402 connected to only a few of the system bonding pads 908 and the system contacts, this is for clarity. An actual embodiment of the present invention may have more of the system bonding pads 908 coupled to the bonding pads 110 than are shown in the figure.

The integrated circuit package system 900 is completed by applying the encapsulant 702, such as an epoxy molding compound, over the package substrate 902. The encapsulant may be on the first stacked die package 904, the second stacked die package 906, the system bonding pad 908, and the electrical interconnect 402.

Figure 10:
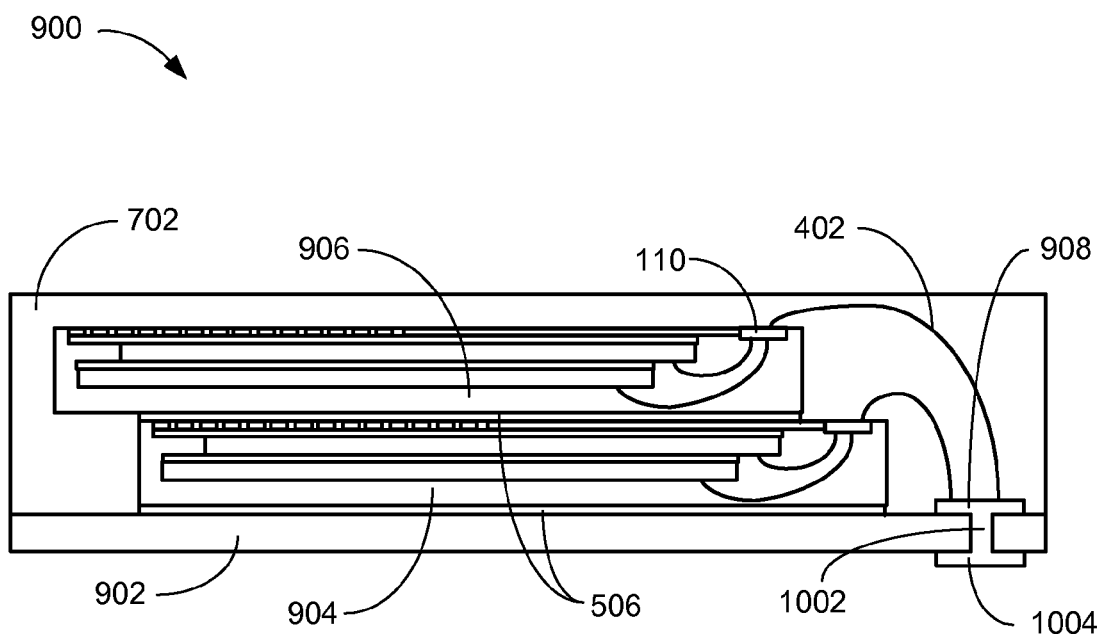
FIG. 10 is a cross-sectional view of the integrated circuit package system of FIG. 9 along a section line 10-10.

Referring now to FIG. 10, therein is shown a cross-sectional view of the integrated circuit package system 900 of FIG. 9 along a section line 10-10. The cross-sectional view of the integrated circuit package system 900 depicts the package substrate 902 having the system bonding pad 908 formed thereon. The first stacked die package 904 is mounted on the package substrate 902, by the adhesive layer 506, with the molded portion facing down. The electrical interconnect 402 couples the bonding pads 110 of the first stacked die package 904 to the system bonding pad 908.

The second stacked die package 906 is mounted on the adhesive layer 506 over the first stacked die package 904 in an off-set position. The second stacked die package 906 is positioned with the molded portion facing down. The figure shows two of the stacked die packages 800 mounted on the package substrate 902, but this is an example only and any number of the stacked die package 800 may be mounted on the package substrate 902. The electrical interconnect 402 couples the bonding pads 110 of the second stacked die package 906 to the system bonding pad 908. A via 1002 couples the system bonding pad 908 to a system contact 1004 on the opposite side of the package substrate 902.

The encapsulant 702 is molded over the package substrate 902 and on the first stacked die package 904, the second stacked die package 906, the system bonding pad 908, and the electrical interconnects 402. The integrated circuit package system 900 takes advantage of being assembled with known good stacked die packages 800. This allows more efficient manufacturing processes and higher yields through the manufacturing process.

Figure 11:
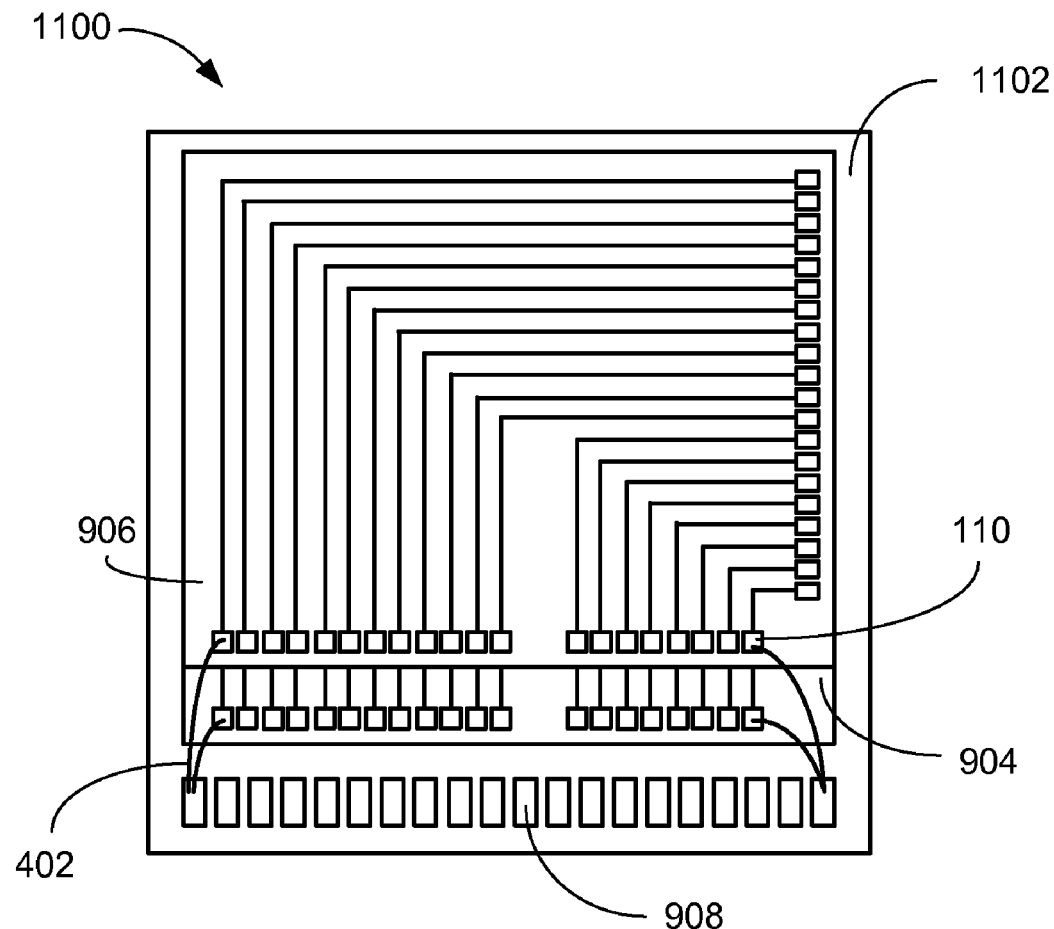
FIG. 11 is a top view of the integrated circuit memory package system, in a square digital package format.

Referring now to FIG. 11, therein is shown a top view of an integrated circuit package system 1100, in a square digital package format. The top view of the integrated circuit package system 1100 depicts a package substrate 1102 in the shape of a square digital package, such as a compact flash memory package. The first stacked die package 904 is mounted on the package substrate 1102. The first stacked die package 904 is positioned so that the bonding pads 110 are accessible for connection to the package substrate 1102.

The second stacked die package 906 is mounted on the first stacked die package 904. The second stacked die package 906 is mounted in an offset position allowing access to the bonding pads 110 of both the first stacked die package 904 and the second stacked die package 906. The system bonding pads 908 are aligned along the narrow edge of the package substrate 1102. The electrical interconnects 402 may couple the system bonding pads 908, the bonding pads 110 on the first stacked die package 904, the bonding pads 110 on the second stacked die package 906, or a combination thereof. The figure shows the electrical interconnects 402 connected to only a few of the system bonding pads 908 and the system contacts, this is for clarity. An actual embodiment of the present invention may have more of the system bonding pads 908 coupled to the bonding pads 110 than are shown in the figure.

The integrated circuit package system 1100 is completed by applying the encapsulant 702, such as an epoxy molding compound, over the package substrate 1102. The encapsulant may be on the first stacked die package 904, the second stacked die package 906, the system bonding pad 908, and the electrical interconnect 402.

Figure 12:
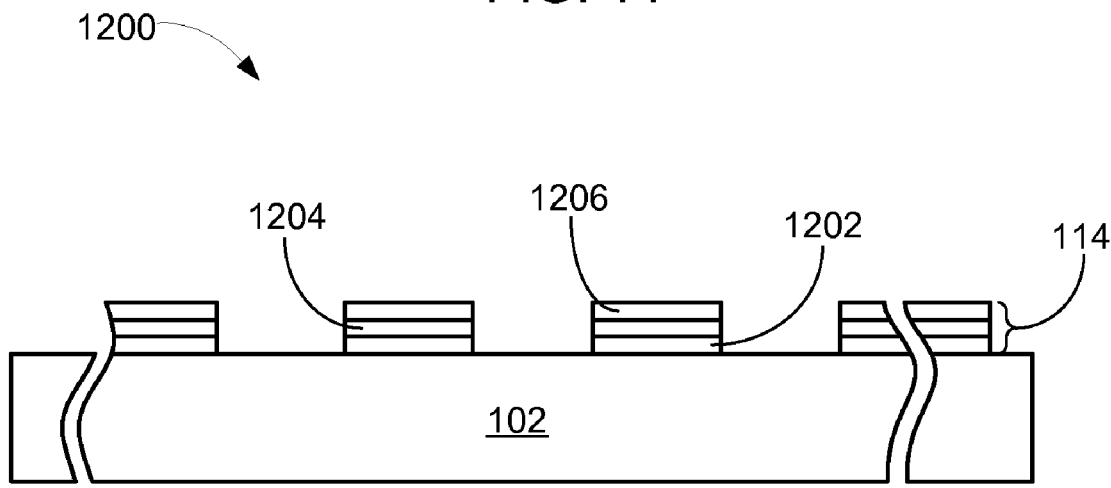
FIG. 12 is a cross-sectional view of the trace frame assembly.

Referring now to FIG. 12, therein is shown a cross-sectional view of the trace frame assembly 100. The cross-sectional view of the trace frame assembly 100 depicts the sacrificial substrate 102 with a first metal trace layer 1202, such as a gold layer, formed thereon. The first metal trace layer 1202 may be detached from the sacrificial substrate 102 by a reaction with a chemical solution, such as an etching solution. A second metal trace layer 1204, such as a nickel layer, is formed on the first metal trace layer 1202. The second metal trace layer 1204 serves to minimize the effects of electromigration and acts as a hard metal base to support interconnection bonding. A third metal trace layer 1206, such as a gold, palladium, or gold-palladium alloy layer, is formed on the second metal trace layer 1204. The third metal trace layer 1206 may act as a bondable layer to provide a suitable surface for a wire bonding process. The metal trace 114 may be made up of the first metal trace layer 1202, the second metal trace layer 1204, and the third metal trace layer 1206.

Figure 13:
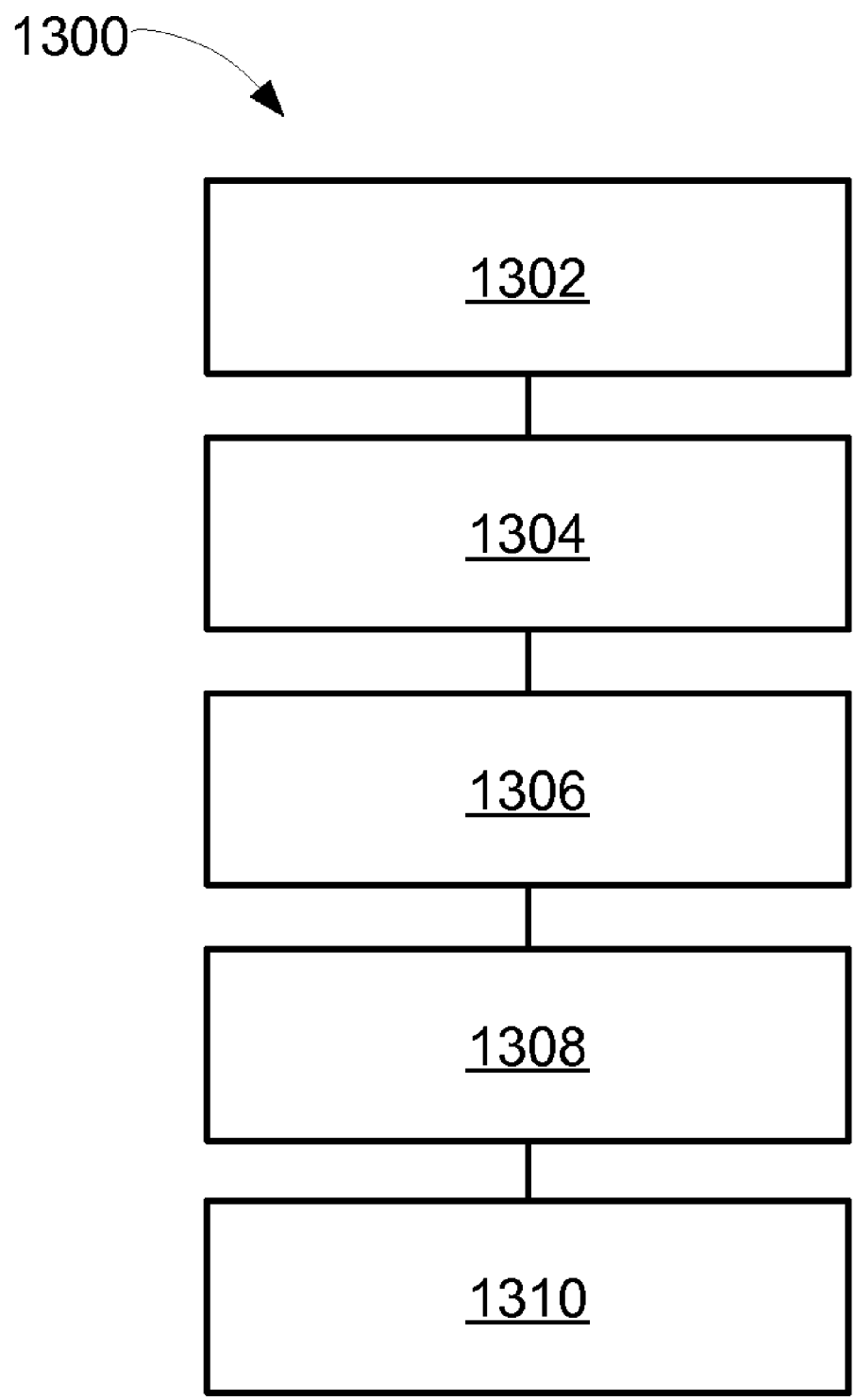
FIG. 13 is a flow chart of an integrated circuit package system for manufacturing the integrated circuit package stacking system, in an embodiment of the present invention.

Referring now to FIG. 13, therein is shown a flow chart of an integrated circuit package system 1300 for manufacturing the integrated circuit package system 900 in accordance with an embodiment of the present invention. The system 1300 includes forming a trace frame including: fabricating a sacrificial substrate in a block 1302; forming a first series of bonding pads along a length of the sacrificial substrate in a block 1304; forming a second series of the bonding pads along a width of the sacrificial substrate in a block 1306; forming conductive traces for connecting the bonding pads of the first series to the bonding pads of the second series in a one to one correspondence in a block 1308; and removing the sacrificial substrate in a block 1310.

It has been discovered that the present invention thus has numerous aspects.

A principle aspect of the present invention is the ability to fabricate a single type of stacked die package that can be used to fabricate two of the most popular standard package formats. The standard package formats are known to be the secure digital memory package and the compact flash memory format.

The Market has wanted high capacity portable storage devices like a memory card, as the die size is getting larger, the final memory card size is already fixed, in a standard package format, such as a secure digital package or a compact flash package. Also most of the memory devices utilize a TSOP package. So, the market wants a real chip scale package to replace the TSOP package while 2 different platforms have different sizes.

This new package concept can meet these two different final product sizes based on final product design & size. If the final product requires a wide width and short length, stacking the package in package width direction to make almost square type and if final product allows long length & short width, stacking the package in length direction to make a large rectangular one without changing the package shape. To meet the final product size, it can be possible by changing the stacking direction with one package design.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for creating high density memory packages. The resulting processes and configurations are straightforward, cost-effective, uncomplicated, highly versatile and effective, can be surprisingly and unobviously implemented by adapting known technologies, and are thus readily suited for efficiently and economically manufacturing flash memory devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising forming a trace frame including:
    fabricating a sacrificial substrate;
    forming a first series of bonding pads along a length of the sacrificial substrate;
    forming a second series of the bonding pads along a width of the sacrificial substrate;
    forming conductive traces for connecting the bonding pads of the first series to the bonding pads of the second series in a one to one correspondence; and
    removing the sacrificial substrate.

2. The method as claimed in claim 1 further comprising:
    mounting a first integrated circuit die on the trace frame;
    mounting a second integrated circuit die on the first integrated circuit die;
    attaching first electrical interconnects between the first integrated circuit die and the first series of the bonding pads, second electrical interconnects between the second integrated circuit die and the second series of the bonding pads, or a combination thereof; and
    molding an encapsulant on the first integrated circuit die, the second integrated circuit die, the electrical interconnects, the conductive traces, and the bonding pads.

3. The method as claimed in claim 1 wherein forming conductive traces including:
    the conductive traces being generally parallel to each other; and
    the conductive traces forming the shortest connection between the bonding pads of the first series and the second series.

4. The method as claimed in claim 1 further comprising forming a package substrate includes forming a rectangular digital package or a square digital package for mounting the trace frame, a first integrated circuit die, and a second integrated circuit die.

5. The method as claimed in claim 1 further comprising applying an encapsulant on a package substrate having the trace frame mounted thereon.

6. A method of manufacturing an integrated circuit package system comprising:
- forming a first stacked die package and a second stacked die package each including:
  - forming a trace frame having a bonding pad,
  - mounting a first integrated circuit die over the trace frame,
  - mounting a second integrated circuit die over the first integrated circuit, and
  - coupling electrically the bonding pad on the trace frame to the first integrated circuit die, the second integrated circuit die, or a combination thereof;
- forming a package substrate having a system bonding pad;
- mounting the first stacked die package over the package substrate; and
- mounting the second stacked die package over the first stacked die package.

7. The method as claimed in claim 6 further comprising coupling first electrical interconnects between the first stacked die package and the system bonding pad, and second electrical interconnects the second stacked die package and the system bonding pad.

8. The method as claimed in claim 6 further comprising forming a system contact on the package substrate including forming a via between the system bonding pad and the system contact.

9. The method as claimed in claim 6 wherein forming the package substrate includes forming a rectangular digital package or a square digital package including mounting the first stacked die package or the second stacked die package and coupling the first series of the bonding pad of the first stacked die package or the second series of the bonding pad of the second stacked die package to the system bonding pad.

10. The method as claimed in claim 6 wherein forming the first stacked die package or the second stacked die package each includes:
- molding an encapsulant on the first integrated circuit die, the second integrated circuit die, the electrical interconnects, and the bonding pads; and
- etching a sacrificial substrate from the trace frame for exposing a conductive trace.

* * * * *